United States Patent [19]

Shinoda et al.

[11] Patent Number: 4,703,453
[45] Date of Patent: Oct. 27, 1987

[54] SEMICONDUCTOR MEMORY WITH AN IMPROVED DUMMY CELL ARRANGEMENT AND WITH A BUILT-IN ERROR CORRECTING CODE CIRCUIT

[75] Inventors: Takashi Shinoda; Osamu Sakai, both of Kodaira, Japan

[73] Assignee: Hitachi, Ltd., Tokyo, Japan

[21] Appl. No.: 466,483

[22] Filed: Feb. 15, 1983

[30] Foreign Application Priority Data

Feb. 15, 1982 [JP] Japan ................................. 57-21130

[51] Int. Cl.$^4$ ...................... G11C 17/00; G11C 29/00
[52] U.S. Cl. .................................... 365/104; 365/210; 365/201; 371/10; 371/38
[58] Field of Search ............... 365/210, 104, 189, 203, 365/201, 94, 103, 200; 371/38, 13, 11, 21, 10

[56] References Cited

U.S. PATENT DOCUMENTS

| | | | |
|---|---|---|---|
| 3,644,902 | 2/1972 | Beausoleil | 365/200 |
| 3,920,976 | 11/1975 | Christensen et al. | 371/38 |
| 4,031,524 | 6/1977 | Heeren | 365/104 |
| 4,342,102 | 7/1982 | Puar | 365/210 |
| 4,345,328 | 8/1982 | White | 371/38 |
| 4,417,328 | 11/1983 | Ochii | 365/203 |
| 4,417,339 | 11/1983 | Cantarella | 371/38 |
| 4,449,203 | 5/1984 | Adlhoch | 365/210 |
| 4,456,995 | 6/1984 | Ryan | 371/21 |
| 4,482,984 | 11/1984 | Oritani | 365/189 |

FOREIGN PATENT DOCUMENTS

| | | | |
|---|---|---|---|
| 0045215 | 2/1982 | European Pat. Off. | |
| 2727419 | 11/1979 | Fed. Rep. of Germany | |
| 0077083 | 6/1980 | Japan | 365/149 |
| 0018086 | 1/1982 | Japan | 365/104 |
| 1484941 | 9/1977 | United Kingdom | |
| 1502058 | 2/1978 | United Kingdom | |
| 1523744 | 9/1978 | United Kingdom | |
| 1571300 | 7/1980 | United Kingdom | |

OTHER PUBLICATIONS

Srini, "Fault Location in a Semiconductor Random Access Memory Unit", IEEE Transactions on Computers, vol. C-27, No. 4, Apr. 1978, pp. 349-358.
Kuo et al, "Sense Amplifier Design is Key to 1-Transistor Cell in 4096 Bit RAM", Electronics, Sep. 13, 1973, pp. 116-121.

Primary Examiner—Stuart N. Hecker
Assistant Examiner—Glenn A. Gossage
Attorney, Agent, or Firm—Antonelli, Terry & Wands

[57] ABSTRACT

In a read only semiconductor memory, signal lines such as data lines are subjected to an undesired parasitic capacitance which restricts the signal changing rate along the lines. The parasitic capacitance which is driven by a memory cell will become increasingly higher as the memory capacity is increased. According to the present invention, a differential sense amplifier is used to amplify the data signals which are read out of the memory cell. At the same time, a dummy cell is used to generate a reference potential which is to be referred to by the differential sense amplifier. In particular, a dummy cell arrangement is provided wherein each dummy cell includes at least two series-connected semiconductor elements to provide a predetermined dummy cell conductance to establish a reference value. Another aspect of the invention lies in the use of column switches between a common data line and data lines of the memory arrays for coupling only one data line at a time through the column switch to the sense amplifier. In addition, a built-in error-correcting-code circuit is provided which operates in conjunction with a selecting circuit so that memory cells delivering a predetermined set of data are spaced apart from one another by at least predetermined distances to reduce the likelihood of errors from immediately adjacent memory cells.

16 Claims, 9 Drawing Figures

SEMICONDUCTOR MEMORY WITH AN IMPROVED DUMMY CELL ARRANGEMENT AND WITH A BUILT-IN ERROR CORRECTING CODE CIRCUIT

BACKGROUND OF THE INVENTION

The present invention relates to a semiconductor memory which is constructed of a monolithic ssemiconductor integrated circuit and, more particularly, to a Read Only Memory (ROM).

In recent years, the demand for a semiconductor memory having a large memory capacity has increased due to the progress in semiconductor technology and the development in application techniques for semiconductor devices. Unfortunately, a number of problems arise in attempting to manufacture such ROM's having a large memory capacity.

For example, the number of memory cells coupled to data lines is increased with the increase in the memory capacity. Moreover, the undesired stray or parasitic capacitance, which is liable to be coupled to the data lines, is increased with the increase in the number of the memory cells. As a result, in a data read out operation, the changing rate of the data signals, which are fed to the data lines by a selected memory cell, is restricted by the relatively large capacitance of the data lines. In other words, the driving ability of the data lines by the selected memory cell is relatively deteriorated.

The signal lines such as the data lines are frequently elongated when it is intended to increase the memory capacity. In this case, since the signal lines themselves have resistances which cannot be neglected, and since undesired capacitances having relatively large values are coupled to the signal lines, these lines experience relatively long signal delays.

In case it is intended to fabricate a semiconductor integrated circuit device having a large capacity, consideration is taken to scale down the circuit elements or wiring layers constructing the semiconductor integrated circuit device with a view to achieving a variety of objects. For example, this can prevent a reduction in the fabrication yield from being caused by the crystal defect of a semiconductor substrate. It can also prevent the area of this semiconductor substrate from being remarkably increased, and the power consumption from being highly increased. On the other hand, the signal lines thus scaled down have relatively high resistances by themselves, and thus experience long signal delays.

In order to make the responding rate of a high-capacity ROM equal to or higher than that of a low-capacity ROM, it is necessary to eliminate the adverse effects which are caused by the relative reduction in the driving ability of the data lines by the memory cell and by the increase in the delay time periods of the signal lines. Also, it is desirable from various standpoints that the power consumption of a ROM be relatively low.

On the other hand, the defects of the memory cells raise special problems in the high-capacity ROM. In this regard, in the prior art, a well-known information theory is an error correcting code which will be hereinafter referred to as "ECC". One aspect of the present invention is that a circuit for correcting errors by the use of the aforementioned ECC (which circuit will be abbreviated hereinafter as the "ECC circuit") is built in a semiconductor memory.

SUMMARY OF THE INVENTION

It is, therefore, an object of the present invention to provide a semiconductor memory which is capable of conducting high-speed operations.

Another object of the present invention is to provide a semiconductor memory having a low power consumption.

Still another object of the present invention is to provide a semiconductor memory which is intended to improve the fabrication yield.

A further object of the present invention is to provide a semiconductor memory which is intended to improve the substantial function of the built-in ECC circuit and to simplify the circuit construction.

Other objects of the present invention will become apparent from the following description taken with reference to the accompanying drawings.

To attain these and other objects in accordance with one aspect of the invention, a differential sense amplifier is used to amplify the data signals which are read out of the memory cell. At the same time, a dummy cell is used to generate a reference potential which is to be referred to by the differential sense amplifier. By the use of the proper dummy cell, the differential sense amplifier is enabled to amplify the data signals quite rapidly. As a result, it is possible to provide a semiconductor memory which can operate at a high speed.

DESCRIPTION OF THE PREFERRED EMBODIMENTS

The present invention will be described in detail in the following in connection with the embodiments thereof.

Figure 1:
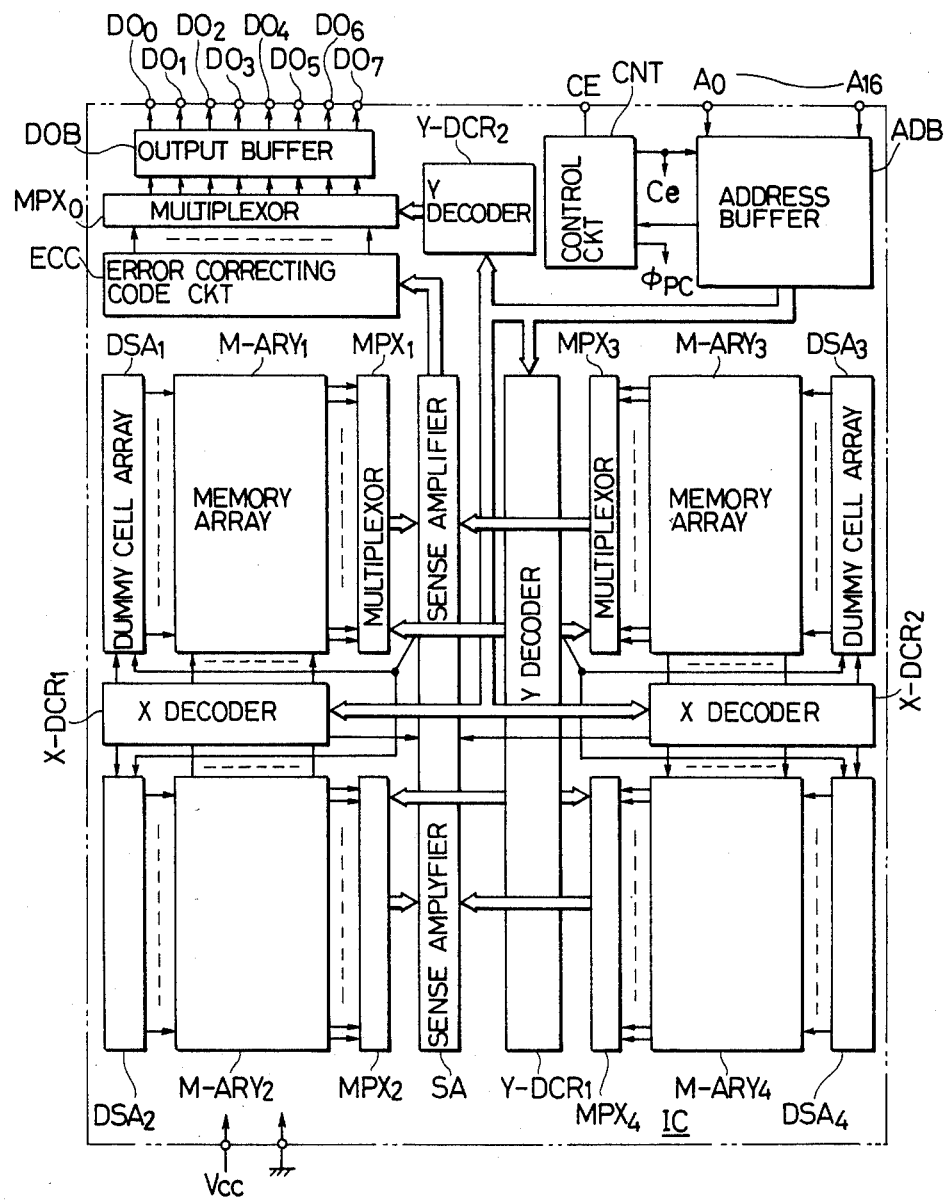
FIG. 1 is a circuit block diagram showing an ROM according to one embodiment of the present invention.

FIG. 1 is a block diagram showing one embodiment where the present invention is applied to a mask ROM.

The ROM shown in the same figure is equipped with four memory arrays $M-ARY_1$ to $M-ARY_4$, although not necessarily limited thereto, and has a total memory capacity of about 1 megabits. Each of the memory arrays $M-ARY_1$ to $M-ARY_4$ is composed of memory arrays, which are arranged to 512 rows × 608 columns, and has a memory capacitance of 311,296 bits. The circuit blocks shown are respectively formed in a semiconductor substrate by the well-known MOS circuit integrating technique. In FIG. 1, the arrangement of the major circuit blocks is made to correspond to the actual geometrical one on the semiconductor substrate.

The insulated gate field effect transistors (which will be shortly referred to as "MOSFETs") for constructing each of the circuit blocks are of an enhancement mode N-channel type unless otherwise specified.

The respective memory arrays $M-ARY_1$ to $M-ARY_4$ have their row addresses selected by X decoders X-

$DCR_1$ and $X-DCR_2$ and their column addresses selected by a Y decoder $Y-DCR_1$.

The two X decoders $X-DCR_1$ and $X-DCR_2$ have word drivers which will become apparent from the following descriptions, and generate $2^{10}$ (=1024) decoded output signals by decoding row address signals $A_0$ to $A_9$. The X decoder $X-DCR_1$ is arranged between the two memory arrays $M-ARY_1$ and $M-ARY_2$ which are arranged at the left-hand side of the drawing, whereas the X decoder $X-DCR_2$ is arranged between the memory arrays $M-ARY_3$ and $M-ARY_4$ which are arranged at the right-hand side of the drawing. The 512 decoded output signals generated by the X decoder $X-DCR_1$ are applied commonly to the memory arrays $M-ARY_1$ and $M-ARY_2$. Likewise, the 512 decoded output signals generated by the X decoder $X-DCR_2$ are applied commonly to the memory arrays $M-ARY_3$ and $M-ARY_4$.

The Y decoder $Y-DCR_1$ generates 32 decoded output signals by decoding column address signals $A_{10}$ to $A_{14}$ of five bits. To the memory arrays $M-ARY_1$ to $M-ARY_4$, there are respectively coupled multiplexors $MPX_1$ to $MPX_4$ which are made operative to act as column switches. Each of the multiplexors $MPX_1$ to $MPX_4$ is fed with the 32 decoded signals of the Y decoder $Y-DCR_1$. One is selected from 32 columns by each of the multiplexors $MPX_1$ and $MPX_4$. Since each of the memory arrays $M-ARY_1$ to $M-ARY_4$ has 608 columns, 19 columns are simultaneously selected from each memory array in response to one Y-decoded output signal.

In accordance with the construction thus far described, 38 memory cells are simultaneously selected in response to one X-decoded output signal and one Y-decoded output signal.

In this embodiment, a sense amplifier SA for amplifying the information signal (or the data signal) which is generated by the selected memory cell is constructed of a differential circuit. The sense amplifier SA is made operative to amplify the voltage difference between the data signal, which is read out of the memory cell, and a predetermined reference voltage. In order to cause the voltage difference, which is to be amplified, to accurately correspond to the content of the data signal read out of the memory cell and to reach a desired level within a relatively short time period, the reference voltage is set not at an absolutely constant level but at a relative level. In other words, the reference voltage is set at such a value as to correspond to the potential at the column to which the memory cell selected is coupled.

In accordance with this embodiment, the column lines of the memory arrays are fed with the reference voltage, although the invention is not limited to this. In order to set the reference voltage at a poorly level, dummy cell arrays $DSA_1$ to $DSA_4$ are provided which respectively correspond to the memory arrays $M-ARY_1$ to $M-ARY_4$. The dummy cell arrays $DSA_1$ to $DSA_4$ are coupled to the column lines of the corresponding memory arrays. The dummy cell arrays $DSA_1$ and $DSA_2$ are respectively selected by the X decoders $X-DCR_1$ and $X-DCR_2$.

The dummy cell arrays $DSA_1$ and $DSA_2$, which are arranged at the left-hand side of FIG. 1, and the dummy cell arrays $DSA_3$ and $DSA_4$, which are arranged at the right-hand side, are alternatively selected in response to the highest bit signal $A_9$ of the X address signals $A_0$ to $A_9$. These address signals are described as having 10 bits although the invention is not especially limited to this. The dummy cell arrays $DSA_1$ and $DSA_2$, which are coupled to the memory arrays $M-ARY_1$ and $M-ARY_2$, are selected when the respective row lines of the memory arrays $M-ARY_3$ and $M-ARY_4$ are selected by the X decoder $X-DCR_2$. On the contrary, the dummy cell arrays, $DSA_3$ and $DSA_4$, which are coupled to the memory arrays $M-ARY_3$ and $M-ARY_4$, are selected when the respective row lines of the memory arrays $M-ARY_1$ and $M-ARY_2$ are selected.

The respective column lines of the memory array $M-ARY_1$ of FIG. 1 are paired with the respective column lines of the memory array $M-ARY_3$. On the other hand, the multiplexor $MPX_1$ is paired with the multiplexor $MPX_3$. In the data read out operation, the same signal as that which is fed from the Y decoder $Y-DCR_1$ to the multiplexor $MPX_1$ is also fed to the multiplexor $MPX_3$. As a result, the same amplifier SA is fed with the data signal to be amplified by way of one of the multiplexors $MPX_1$ and $MPX_3$ and with the reference voltage by way of the other multiplexor. Likewise, the column lines of the memory array $M-ARY_2$ are paired with the column lines of the memory array $M-ARY_4$, and the multiplexors $MPX_2$ and $MPX_4$ are paired with each other.

The data signals of 38 bits, which are read out of the 38 memory cells selected in response to one of the X-decoded output signals and one of the Y-decoded output signals, are amplified by the sense amplifier SA and are fed to an ECC circuit so that their errors are corrected by the ECC circuit. In the signals of 38 bits fed to the ECC circuit, 32 bits are used as the data signals while the remaining 6 bits are used as the parity signals. In response thereto, the ECC circuit generates data signals of 32 bits, which have their errors corrected.

The information signals (or the output data) of 32 bits having their errors corrected by the ECC circuit are fed to a multiplexor $MPX_0$ which is provided to reduce the number of the external terminals of the ROM. The respective 8 bits of the output data signals of 32 bits are selected by the action of the multiplexor $MPX_0$. The data signals of 8 bits are fed through an output buffer DOB to the external termainsl $DO_0$ to $DO_7$ of the ROM. As a result, the data signals of 32 bits of the ECC circuit are transferred sequentially four times to the external terminals $DO_0$ to $DO_7$. For these sequential output operations, address signals $A_{15}$ and $A_{16}$ are used. The shown ROM is equipped with a Y decoder $Y-DCR_2$ for decoding the address signals $A_{15}$ and $A_{16}$, although not especially limited thereto. The multiplexor $MPX_0$ has its operations controlled by the decoded signals which are generated by the Y decoder $Y-DCR_2$. As a result, the data signals of 32 bits are consecutively fed to the external terminals $DO_0$ to $DO_7$ in accordance with the fact that the states of the address signals $A_{15}$ and $A_{16}$ of 2 bits are consecutively changed.

The ROM shown in FIG. 1 is equipped with an address buffer ADB. This address buffer ADB receives the external address signals $A_0$ to $A_{16}$ through the external terminals thereby to generate internal address signals $a_0$ and $\overline{a}_0$ to $a_{16}$ and $\overline{a}_{16}$ at true and false levels, which are to be fed to the decoders. The address buffer ADB has its operations controlled by the chip select signal Ce which is fed from a control circuit CNT.

This control circuit CNT generates the chip select signal Ce in response to an external chip select signal CE which is to be fed to the external terminals. The control circuit CNT is equipped with a signal generator (not shown) for generating percharge pulses $\phi_{pc}$, as well as with such signal generators $\phi_x$-Gen and $\phi_y$-Gen as will become apparent from FIGS. 3 and 4.

The address signals which are required by the internal signal generators of the control circuit CNT are fed from the address buffer ADB.

The not-shown signal generator for generating the precharge pulses $\phi_{pc}$ can be constructed of a circuit for detecting the change in the level of at least one of the address signals $A_0$ to $A_{16}$ and a suitable circuit such as a pulse generating circuit. The precharge pulses $\phi_{pc}$ are set at a high level for a predetermined time period when the chip select signals are fed to the terminal CE and when at least one of the signals $A_0$ to $A_{14}$ of the address signals $A_0$ to $A_{16}$ is changed while the chip select signals are being fed. Such signal generators for producing precharge pulses are well known and, accordingly, not detailed herein.

To the memory arrays, there are respectively coupled such precharge elements as will be made apparent from the later description. The data lines (i.e., the column lines) of the respective memory arrays are reset by the fact that the precharge elements are operated by the precharge pulses $\phi_{pc}$. The data can be read out rapidly by virtue of the fact that the respective data lines are forcibly reset irrespective of their previous levels. The precharge pulses $\phi_{pc}$ are also used for resetting the sense amplifier.

The ROM according to the embodiment shown is used as a character generator for producing Chinese characters, although it is not especially limited thereto. The pattern of one character is displayed with display dots which are arranged in a matrix form of 32 rows× and 32 columns, for example. Since one letter requires data signals of 32 bits×32 bits, the ROM of the embodiment can store 1024 character patterns.

Figure 2A:
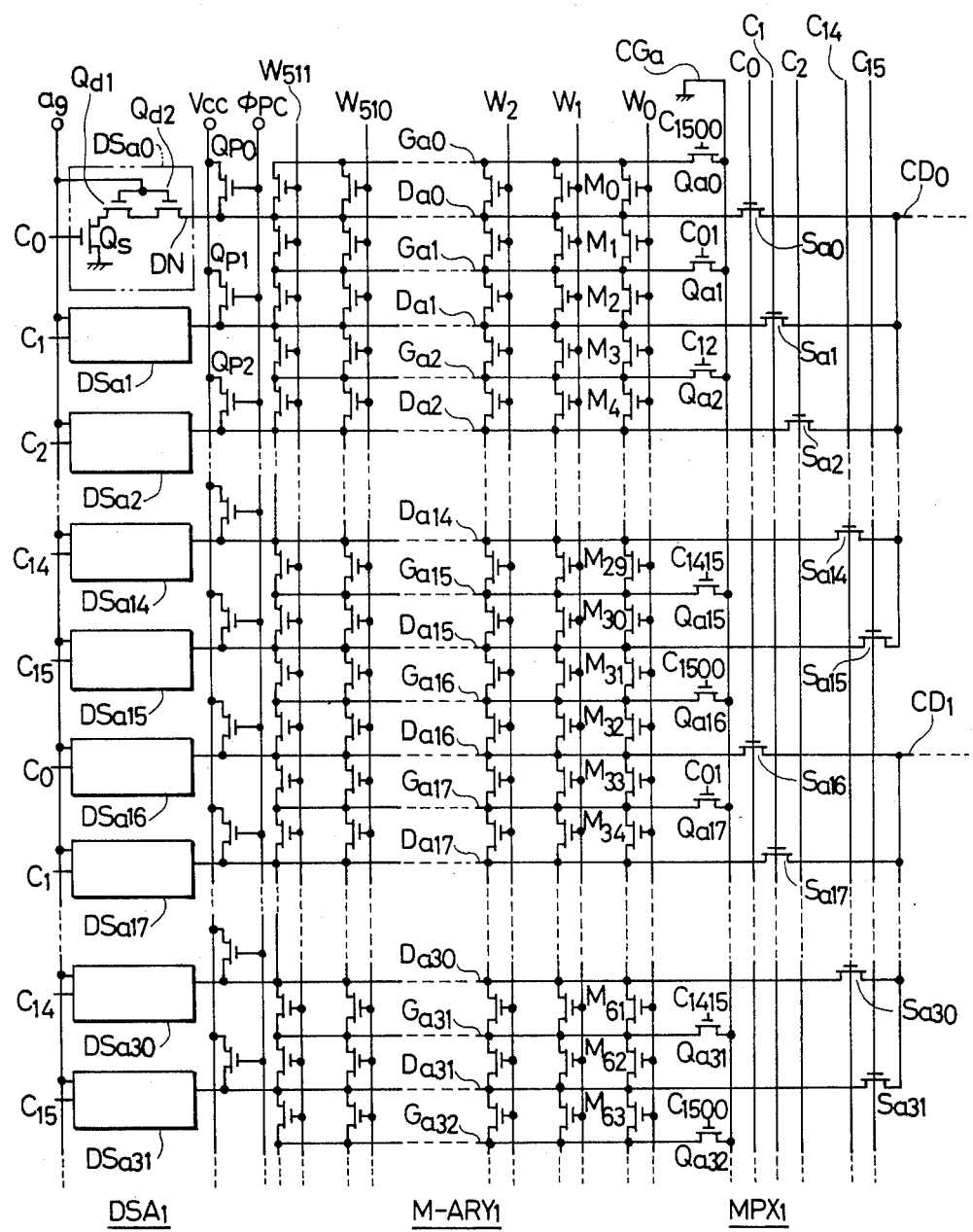
FIGS. 2A, 2B and 2C are specified circuit diagrams showing the circuit blocks $DSA_1$, $M-ARY_1$, $MPX_1$, SA, $MPX_3$ and $DSA_3$ of FIG. 1.
Figure 2B:
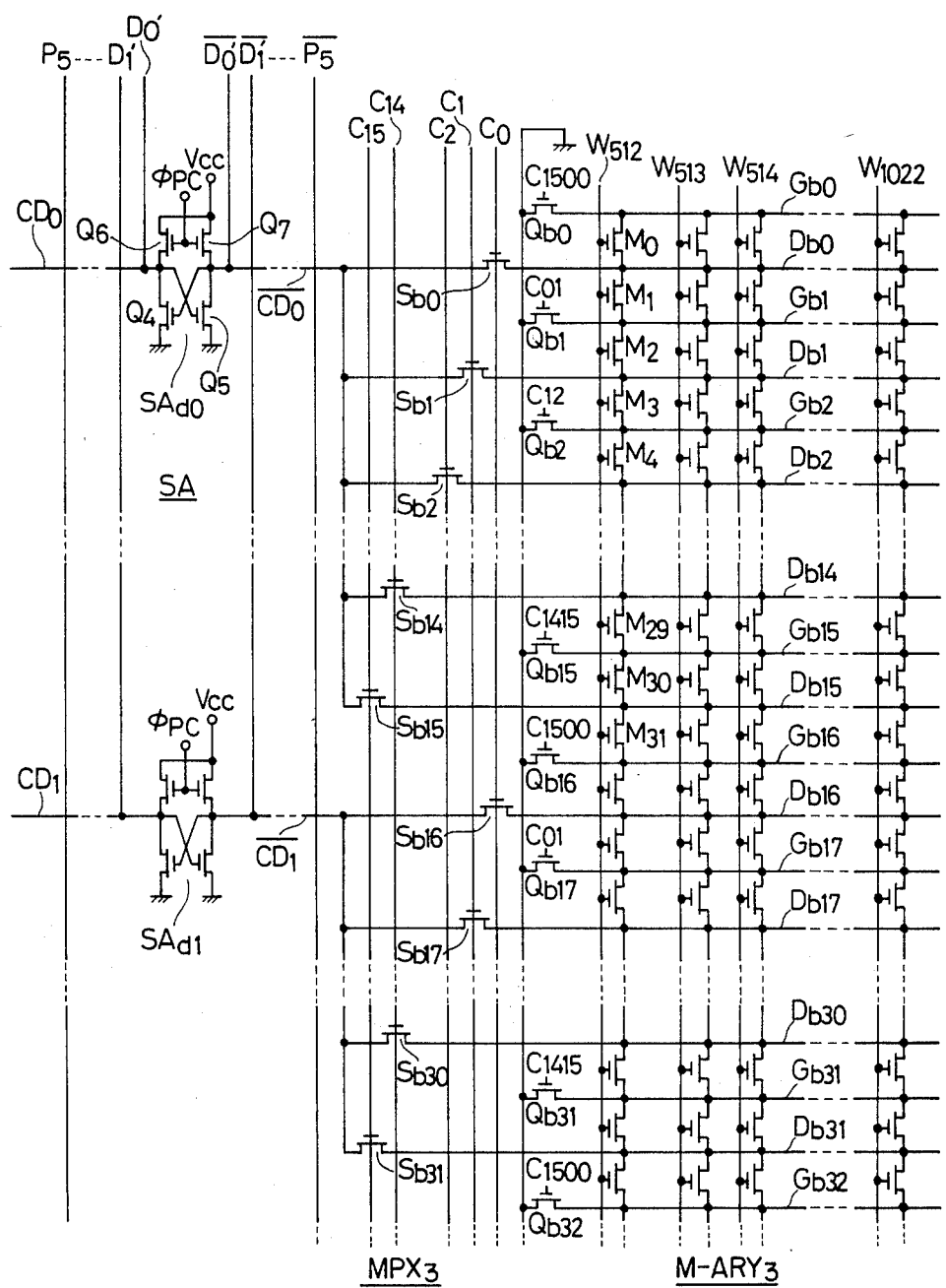
Figure 2C:
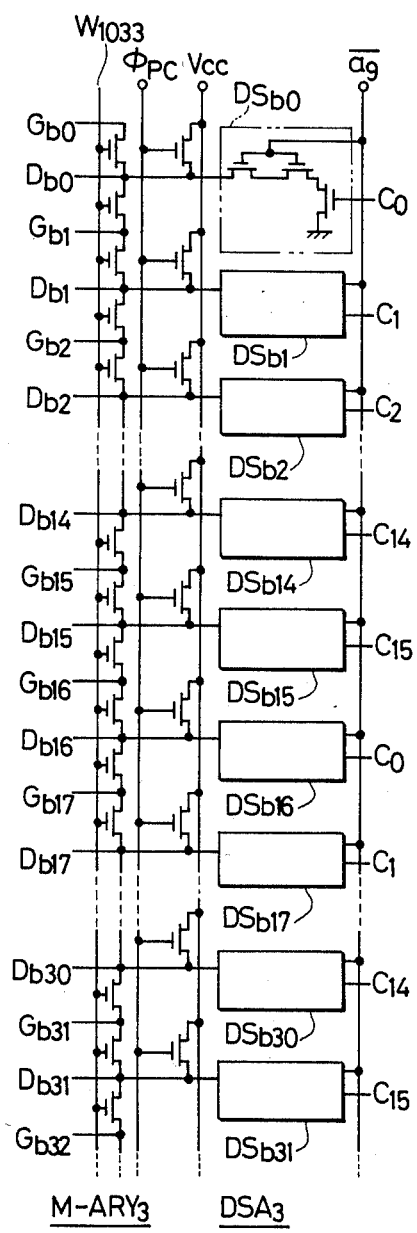

FIGS. 2A to 2C show specific circuits of the aforementioned memory arrays, multiplexors, dummy cell arrays and the sense amplifier.

The memory arrays M-ARY$_1$ and M-ARY$_3$ are made to have a substantially identical construction. The memory array M-ARY$_1$ (see FIG. 2A) has 512 word lines $W_0$ to $W_{511}$ which are elongated in the vertical direction of the drawing. The 512 word lines of the memory array M-ARY$_1$ are made common with the 512 word lines of the memory array M-ARY$_2$ which is shown in FIG. 1. Likewise, the memory array M-ARY$_3$ (see FIG. 2B) has 512 word lines which are elongated in the vertical direction of the drawing. The 512 word lines of the memory array M-ARY$_3$ are also made common with the 512 word lines which are provided in the memory array M-ARY$_4$ shown in FIG. 1. The respective word lines are considered as row lines.

The memory array M-ARY$_1$ also has grounding lines and data lines which are elongated in the horizontal direction of the drawing and which are alternately arranged. As shown in FIG. 2A, the first line $G_{a0}$ is the grounding line whereas the second line $D_{a0}$ is the data line. In the drawing, the respective grounding lines are designated at suffix G whereas the respective data lines are designated at suffix D.

The data lines can be considered to respectively construct the column lines. The memory array M-ARY$_1$ of FIG. 1 has the 608 column lines, as has been described hereinbefore. In the memory array M-ARY$_1$ of FIG. 2A, however, one data line is made to substantially correspond to two column lines, as will become apparent from the following description. As a result, the number of the data lines belonging to the memory array M-ARY$_1$ is effectively set not at 608 but at half of this, i.e., 304. The ROM can be highly integrated by this reduction in the number of the data lines.

The respective data lines of the memory array M-ARY$_1$ are coupled through the multiplexor MPX$_1$ to common data lines CD$_0$ and CD$_1$ and so on. Since each data lines substantially corresponds to two column lines, 16 (i.e., 32/2) data lines, e.g., $D_{a0}$ to $D_{a15}$, are made to correspond to one common data line, e.g., CD$_0$.

In the memory array M-ARY$_1$, memory MOSFETs $M_0$ to $M_{31}$ are formed to respectively correspond to the nodes of the aforementioned word and data lines. Each of the memory MOSFETs has its gate connected with the corresponding word line, its drain connected with the corresponding data line and its source connected with the corresponding grounding line. With the respective data lines and the respective grounding lines other than a grounding line $G_{a0}$, which is arranged at the end portion of the memory array M-ARY$_1$, there are commonly connected the drains and sources of the respective memory MOSFETs $M_0$, $M_1$, $M_2$ and so on which are connected with an identical word line. Although not especially limited thereto, the grounding lines and the data lines are constructed of the semiconductor regions which are integrally formed with the semiconductor regions constructing the sources and drains of the memory MOSFETs. Each of these memory MOSFETs has its threshold voltage predetermined to correpond to the information "0" or "1", as will be explained hereinafter.

In accordance with the present embodiment, the multiplexor MPX$_1$ is constructed of transmission gate MOSFETs which are substantially interposed betweem the data lines and the common data lines, and switch MOSFETs which are interposed between the respective grounding lines and a common grounding line CG$_a$. For example, the data lines $D_{a0}$ to $D_{a15}$ are coupled to the common data line CD$_0$ through transmission gates MOSFETs $S_{a0}$ to $S_{a15}$ which construct the multiplexor. The common data line CD$_0$ is connected with one of the input terminals of the sense amplifier. On the other hand, the grounding lines $G_{a0}$ to $G_{a15}$ are connected with the common grounding lines CG$_a$ through switch MOSFETs $Q_{a0}$ to $Q_{a15}$ which act as column switches.

The MOSFETs $S_{a0}$ to $S_{a15}$ have their gates respectively fed with the decoded signals $C_0$ to $C_{15}$ which are generated by the Y address decoder Y-DCR$_1$ shown in FIG. 1. The decoded signals $C_0$ to $C_{15}$ are generated by decoding the address signals $A_{10}$ to $A_{13}$. The MOSFETs $Q_{a0}$ to $Q_{a15}$ have their gates fed with the decoded signals $C_0$ to $C_{15}$ and the decoded signals $C_{01}$ to $C_{1500}$ which are generated by logical circuits (not shown) which are made receptive of the address signal $A_{14}$. It is necessary to complementarily switch the switch MOSFET, which is coupled to the grounding line arranged at one side of the data line to be selected, and the switch MOSFET which is coupled to the grounding line arranged at the other side of that data line. It is also necessary that the switch MOSFET such as the MOSFET $Q_{a1}$, which is coupled to the grounding line interposed between the two data lines, be driven into conduction when the memory MOSFET interposed between that grounding line and one of the data lines is to be selected and when the memory MOSFET interposed between that grounding line and the other data line is to be selected. For example, therefore, the aforementioned decoded signal $C_{1500}$ is preset at such a value as to satisfy the relationship expressed by the following logical equation (1), whereas the aforementioned decoded signal $C_{01}$ is similarly preset at such a value as to satisfy the relationship expressed by the following logical equation (2):

$$C_{1500} = C_0 \cdot \overline{a_{14}} + C_{15} \cdot a_{14} \qquad (1);$$

and $$C_{01} = C_0 \cdot a_{14} + C_1 \cdot \overline{a_{14}} \qquad (2).$$

In FIG. 2A, the grounding lines which are arranged above the respective data lines $D_{a0}$ to $D_{a15}$ are selected by the AND signals of the decoded signals $C_0$ to $C_{15}$ and the internal address signal $\overline{a_{14}}$, whereas the grounding lines which are arranged below the respective data lines $D_{a0}$ to $D_{a15}$ are selected by the AND signals of the decoded signals $C_0$ to $C_{15}$ and the address signal $a_{14}$. In this way, it is possible to control whether a memory cell above the data line or below the data line is selected when the data line has received a signal from the Y decoder.

In accordance with the present embodiment, the dummy cells $DS_{a0}$ to $DS_{a31}$ are respectively coupled to the data lines. The dummy cells are made to all have an identical construction to one another. In FIG. 2A, only the circuit of the dummy cell $DS_{a0}$ is specifically shown so as to simplify the illustration. The dummy cell $DS_{a0}$ is constructed, although no especially limited thereto, of MOSFETs $Q_{d1}$ and $Q_{d2}$ which are connected in series with each other and which are adopted to be switched by an internal address signal $a_9$, and of a MOSFET $Q_s$ which is connected in series with the MOSFETs $Q_{d1}$ and $Q_{d2}$ and which is adapted to be switched by the decoded signal $C_0$.

The MOSFETs $Q_{d1}$ and $Q_{d2}$ are made to have the same size as that of the memory MOSFETs of the memory array, although not especially limited thereto. As will be explained in more detail hereinafter, the memory arrays are constructed so that some of the memory MOSFETs have a low threshold voltage while others have a high threshold voltage. The MOSFETs $Q_{d1}$ and $Q_{d2}$ are fabricated simultaneously with an in the same size as those of the memory MOSFETs which have a low threshold voltage. As a result, the composite conductance of two MOSFETs $Q_{d1}$ and $Q_{d2}$ when they are conductive is made to have about half the value of the conductance of the single memory MOSFET having the low threshold voltage when the latter is selected. On the other hand, the memory MOSFETs which have a high threshold voltage are held in their substantially conducting states irrespective of the fact that they are selected or not. As a result, the composite conductance of the MOSFETs $Q_{d1}$ and $Q_{d2}$ of the dummy cells is made to have a higher conductance than that of the memory MOSFET having a high threshold voltage when the latter is selected. In other words, the composite conductance of the MOSFETs $Q_{d1}$ and $Q_{d2}$ takes an intermediate value between the conductance of the memory MOSFET having the low threshold voltage and the conductance of the memory MOSFET having the high threshold voltage.

The MOSFET $Q_s$ of the dummy cell is provided to reduce the power consumption at the dummy cells which are not selected. The MOSFET $Q_s$ has its size so set as to have a sufficiently higher conductance than the composite one of the MOSFETs $Q_{d1}$ and $Q_{d2}$. As a result, the conductance of the dummy cell in the selected state, i.e., the conductance between the output node DN of the dummy cell and the ground potential point of the circuit is substantially equal to the composite conductance of the MOSFETs $Q_{d1}$ and $Q_{d2}$.

As has been described hereinbefore, the MOSFETs $Q_{d1}$, $Q_{d2}$ and $Q_s$ constructing the dummy cell are formed simultaneously with the memory MOSFETs. As a result, it is possible to provide these dummy cells while avoiding any increase in the numbers of the fabrication steps of the ROM. Moreover, it is possible to make effective use of the well-known feature of the integrated circuit fabrication technique that there are few characteristic dispersions between the circuit elements which are simultaneously formed. More specifically, in case the characteristics of the memory MOSFETs, e.g., the conductances thereof are changed by the dispersions or the like in the fabrication conditions, similar characteristic changes occur in the aforementioned MOSFETs $Q_{d1}$ and $Q_{d2}$. As a result, the composite conductance of the MOSFETs $Q_{d1}$ and $Q_{d2}$ can be reduced to about a half of the conductance of the memory MOSFETs having the low threshold voltage without being substantially influenced by the dispersions or the like in the fabrication conditions. Thus, it is possible to fabricate a memory which can enjoy a high yield.

Figure 3:
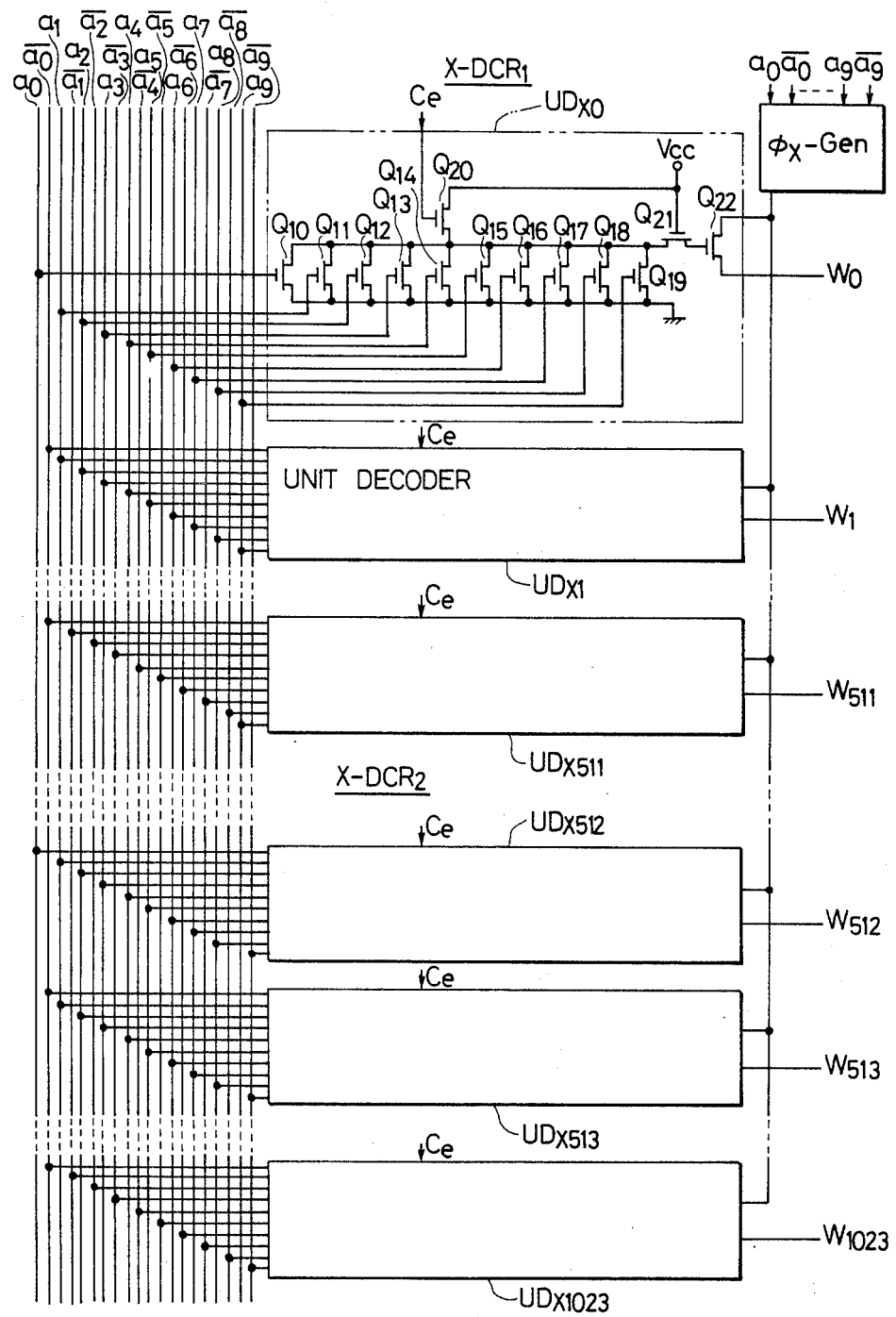
FIG. 3 is a circuit diagram showing an X-decoder.
Figure 4:
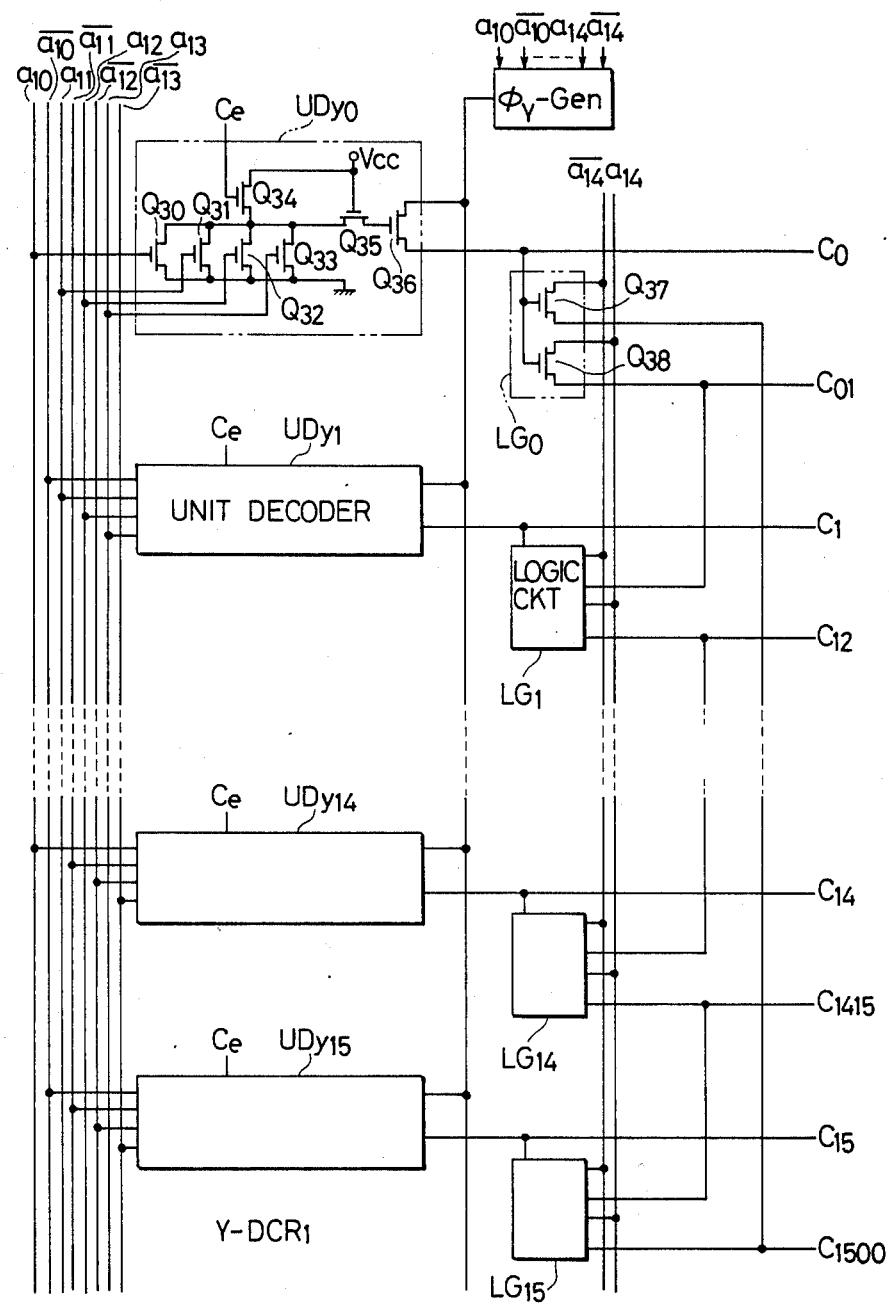
FIG. 4 is a circuit diagram showing a Y-decoder.

In accordance with the present embodiment, moreover, there are respectively coupled to the data lines the precharge MOSFETs $Q_{p0}$, $Q_{p1}$ and so on which are adapted to be switched by the precharge pulses $\phi_{pc}$. These precharge pulses $\phi_{pc}$ are generated by the control circuit CNT shown in FIG. 1, as has been described hereinbefore. The precharge pulses $\phi_{pc}$ are set, as has been described hereinbefore, at the high level for a predetermined time period when the address signals are to be fed from the address buffer ADB. The control circuit CNT also generates the chip select signal Ce which is to be fed to such circuits as are shown in FIGS. 3 and 4. The chip select signal Ce is set at a high level in accordance with the fact that the chip select signal CE coming from the outside of the IC is at a high level, for example. The chip select signal Ce thus set is fed to the address buffer, the decoders and so on. The address buffer, the decoders and so on are activated in response to the high level of the chip select signal Ce and are inactivated in response to the low level of the same signal. Thus, unnecessary power consumption of the ROM as a whole can be reduced by the controls of the respective circuits by the chip select signal Ce.

In FIG. 2B, a sense amplifier $SA_{d0}$ is constructed of latch type amplifying MOSFETs $Q_4$ and $Q_5$ which have their gates and drains cross-linked, and of precharge MOSFETs $Q_6$ and $Q_7$ which are connected with the respective drains of the former MOSFETs $Q_4$ and $Q_5$.

By the fact that the precharge MOSFETs $Q_6$ and $Q_7$ are made to have relatively high conductances, the paired input and output terminals of the sense amplifier $SA_{d10}$ are precharged to a high level when the precharge pulses $\phi_{pc}$ are generated which is substantially equal to a power source voltage $V_{cc}$. The paired input and output terminals of the sense amplifier $SA_{d10}$ are fed with the output signals which come from the corresponding left and right memory arrays M-ARY$_1$ and M-ARY$_3$ by way of the common data lines $CD_0$ and $\overline{CD_0}$. In the same manner, the sense amplifier $SA_{d1}$ is fed with the output signals which come from the memory arrays M-ARY$_1$ and M-ARY$_3$ through the common data lines CD$_1$ and $\overline{CD}_1$.

In each of the memory arrays, the writing operation of the information in the memory MOSFETs is conducted, although not especially limited thereto, by implanting impurity ions in the regions which are to be formed as the channels of the memory MOSFETs. In other words, the threshold voltage of the memory MOSFETs is determined by the impurity ion implantations. The channel-formed regions of the memory MOSFETs required to have the high threshold voltage, for example, are implanted with the impurity ions which have the conduction type inverted from the channel conduction type. On the other hand, no ion implantation for shifting the threshold value is conducted at the channel-formed regions of the memory MOSFETs which are required to have the low threshold voltage. As a result, the binary signal "1" or "0" can be written in the memory MOSFETs. In this case, although not especially limited thereto, the high threshold voltage of the memory MOSFETs, which is determined by the ion implantation, is made to correspond to the value "1" of the binary signal. The low threshold voltage of the memory MOSFETs into which no ions have been implanted is made to correspond to the value "0" of the binary signal.

As will be described in detail hereinafter, the read out operations are conducted by detecting whether the memory MOSFETs are rendered substantially conducting or non-conducting, when they are selected by the voltage applied between their gates and sources. In other words, the read out operations correspond to the detection of whether the conductance of the memory MOSFET selected is high or low. The reference for this detection of the level is given by the aforementioned dummy cells, as has been described hereinbefore.

Next, the operations of the mask type ROM of the present embodiment will be described in the following.

For this discussion, it is assumed that those of the decoded signals generated by the X decoder X-DCR$_1$ shown in FIG. 1, which are to be fed to the word line W$_0$, for example, are set at the high level together with those C$_0$ of the decoded signals generated by the Y decoder Y-DCR$_1$ shown in FIG. 1 by the suitable combinations of the address signals A$_0$ to A$_{13}$. With this assumption, the transfer MOSFETs S$_{a0}$, S$_{a16}$ and so on, which are coupled to the data lines D$_{a0}$, D$_{a16}$ and so on, are driven into conduction by the action of the decoded signal C$_0$. Accordingly, the memory MOSFETs M$_0$ and M$_1$, and M$_{32}$ and M$_{33}$, which have their drains coupled to the data lines D$_{a0}$ and D$_{a16}$ and their gates coupled to the aforementioned word line W$_0$, are brought into states in which they can be selected.

It is determined by the address signal A$_{14}$ which of the memory MOSFETs M$_0$ or M$_1$ is to be selected and which of the MOSFETs M$_{32}$ or M$_{33}$ is to be selected. For example, in case the internal address signal a$_{14}$ is set at the high level in accordance with the fact that the address signal A$_{14}$ is set at the high level, the decoded output signal C$_{01}$ of the Y decoder D-DCR$_1$ is accordingly set at the high level. As a result, the switch MOSFETs Q$_{a1}$, Q$_{a17}$ and so on are rendered conducting so that the grounding lines G$_{a1}$, Ga$_{17}$ and so on are set at the ground potential of the circuit. As a result, the potential at the word line W$_0$ is applied between the gate and source of the memory MOSFET M$_1$ of the two memory MOSFETs M$_0$ and M$_2$. In short, the memory MOSFET M$_1$ of a memory group (M$_0$–M$_{31}$) is selected.

In a similar manner, the MOSFET M$_{33}$ of a second memory group (M$_{32}$–M$_{63}$) is likewise selected from M$_{32}$ and M$_{33}$.

When the word line W$_0$ is selected, incidentally, none of the decoded signals which will raise the potentials of the word lines W$_{512}$ to W$_{1023}$ of the memory array M-ARY$_3$ to the high level is generated by the X decoder X-DCR$_2$, as has been described hereinbefore. As a result, none of the memory MOSFETs constructing the memory array M-ARY$_3$ is selected.

Next, the selection of the dummy cells will be described.

As has been described hereinbefore, the memory array M-ARY$_1$ is selected by the low level of the highest address signal A$_9$ of the address signals A$_0$ to A$_9$ of 10 bits, which are fed to the X decoder. At this time, in accordance with the address signal A$_9$, the internal address signal $\overline{a_9}$ is set at the high level whereas the address signal a$_9$ is set at the low level. On the contrary, the memory array M-ARY$_3$ is selected by the high level of the highest address signal A$_9$.

Thus, in case the address signals A$_0$ to A$_9$ are so set that the memory MOSFET M$_1$ coupled to the word line W$_0$ in the memory array M-ARY$_1$ may be selected, the MOSFETs Q$_{d1}$ and Q$_{d2}$ of the respective dummy cells constructing the dummy cell array DSA$_3$ are rendered conductive by the high level of the internal address signal $\overline{a_9}$. As a result, the dummy cell array DSA$_3$ is brought into its selectable state. At this time, the dummy cell array DSA$_1$ is not brought into its selectable state because the address signal a$_9$ is at the low level.

In the present embodiment, as has been described hereinbefore, the predetermined ones of the respective dummy cells which construct the dummy cell array DSA$_3$ in its selectable state are selected. In order to select the data lines, more specifically, the respective decoded signals generated by the Y decoder Y-DCR$_1$ are also fed to the MOSFET Q$_s$ of each dummy cell. As a result, in case the memory MOSFETs M$_1$, M$_{33}$ and so on coupled to the word line W$_0$ are selected, the dummy cells DS$_{b0}$, D$_{b16}$ and so on of the memory array M-ARY$_3$, are accordingly selected. The dummy cells coupled to the other data lines DS$_{b1}$ to DS$_{b15}$ are left unselected. As a result, of the not-shown parasitic capacitances, which are coupled to the respective data lines D$_{b0}$, D$_{b31}$ and so on precharged through the precharge MOSFETs, the parasitic capacitances coupled to the data lines D$_{b1}$, D$_{b15}$ and so on do not have their charges discharged through the dummy cells. Thus, it is possible to eliminate ineffective power consumption.

The memory MOSFET M$_1$ is made to have a conductance which can be determined in accordance with the memory information given, as has been described hereinbefore. As a result, the charges at the data line D$_{a0}$, which has been precharged through the precharge MOSFET Q$_{p0}$, begin to be released, when the memory MOSFET M$_1$ is selected, in accordance with the information which has been stored in that MOSFET M$_1$.

The dummy cell DS$_{b0}$, which is selected simultaneously with the memory MOSFET M$_1$, has an intermediate conductance between the conductance of the memory MOSFET, which is stored with the information "1", and the conductance of the memory MOSFET which is stored with the information "0", as has been described hereinbefore. As a result, the charge at the data line D$_{b0}$, which has been precharged through the precharge MOSFET, begins to be released, when the dummy cell $DS_{b0}$ is selected, in accordance with the conductance of that dummy cell.

Figure 7:
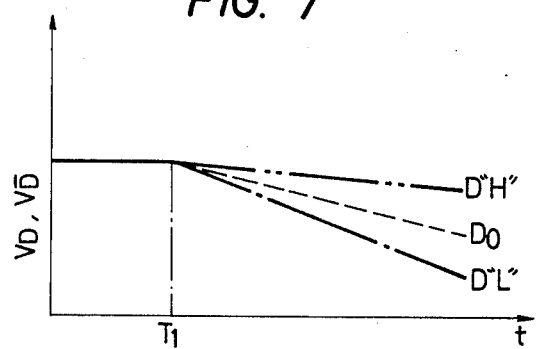
FIG. 7 is a diagram illustrating the operational waveforms of the circuits of FIGS. 2A to 2C.

FIG. 7 illustrates the changing behaviors of the potentials $V_D$ and $V_{\overline{D}}$ at the aforementioned paired data lines $D_{a0}$ and $D_{b0}$ with respect to time. In this figure, a broken line illustrates the potential change of the data line $D_{b0}$ to which the dummy cell is coupled. On the other hand, a single-dotted line illustrates the potential change of the data line $D_{a0}$ when the memory MOSFET $M_1$ is stored with the information "0", whereas a double-dotted line illustrates the potential change of the data line $D_{a0}$ when the memory MOSFET $M_1$ is stored with the information "1".

The sense amplifier $SA_{a0}$ amplifies the potential difference between those paired data lines $D_{a0}$ and $D_{b0}$ thereby to feed its amplified signal to common data lines $D_0'$ and $\overline{D_0'}$.

In this case, the lines $D_{a2}$ to $D_{a15}$ of the data lines $D_{a1}$ to $D_{a15}$ of the memory array M-ARY$_1$ do not have their corresponding grounding lines selected. As a result, the precharge level of the data lines $D_{a2}$ to $D_{a15}$ is held as it is thereby to prevent any ineffective current consumption from being caused.

The data line $D_{a1}$ is discharged in response to the fact that the memory MOSFET $M_2$ is rendered conductive by the selection of the word line $W_0$, for example, because the MOSFET $Q_{a1}$ is conducting. As a result, ineffective power consumption, which would be caused if the charge of the data line is left unselected, is remarkably reduced according to the present embodiment.

As will be detailed with reference to FIGS. 5 and 6, in the present embodiment, a binary signal which is inverted from the binary signal to be stored is written in the memory MOSFETs constructing the memory arrays M-ARY$_3$ with a view to reducing both the number of the elements constructing the ECC circuit and the power consumption in the ECC circuit. More specifically, in case the memory MOSFET $M_0$ of the memory array M-ARY$_3$, for example, is to be stored with the binary signal "1", it is written with the binary signal "0" which is inverted from the foregoing binary signal "1". By this writing operation, a level corresponding to the binary signal stored in the memory MOSFET is always fed from the left-hand input and output terminals of the sense amplifier, no matter which memory array M-ARY$_1$ or M-ARY$_3$ might allow its memory MOSFET to be selected. From the right-hand input and output terminals of the sense amplifier, on the other hand, there is fed a level which corresponds to the binary signal inverted from the aforementioned one.

FIG. 3 is a circuit diagram showing the embodiments of the X-address decoders X-DCR$_1$ and X-DCR$_2$ of FIG. 1.

The X address decoder X-DCR$_1$ is constructed of a plurality of unit decoders UD$_{x0}$ to UD$_{x511}$ which are made to correspond one-to-one to the word lines $W_0$ to $W_{511}$, whereas the X address decoder X-DCR$_2$ is constructed of a plurality of unit decoders UD$_{x512}$ to UD$_{x1023}$ which are similarly made to correspond one-to-one to the word lines $W_{512}$ to $W_{1023}$.

The respective unit decoders UD$_{x0}$ to UD$_{x1023}$ are made to have constructions identical to each other. FIG. 3 specifically shows only the circuit of the unit decoder UD$_{x0}$.

In the same figure, the unit decoder UD$_{x0}$ is constructed of: the logical MOSFETs $Q_{10}$ to $Q_{19}$ which are adapted to be fed with a predetermined combination of the address signals $a_0$ and $\overline{a_0}$ to $a_9$ and $\overline{a_9}$; a precharge MOSFET $Q_{20}$ which is connected between the common drain of the former two MOSFETs and the power source terminal $V_{cc}$; a cut MOSFET $Q_{21}$; and an output MOSFET $Q_{22}$ which is adapted to be fed with the decoded signal through the cut MOSFET $Q_{21}$.

The precharge MOSFET $Q_{20}$ has its gate fed with the control signal (i.e., the chip select signal) Ce, whereas the output MOSFET $Q_{22}$ has its drain fed with the output of the signal generator $\phi_x$-Gen.

This signal generator $\phi_x$-Gen is made operative to generate its signal at a high level in response to the address signals $a_0$ and $\overline{a_0}$ to $a_9$ and $\overline{a_9}$ if even one group of the address signals $a_0$ and $\overline{a_0}$ to $a_9$ and $\overline{a_9}$ have their levels varied.

The output of the unit decoder UD$_{x0}$ will now be described.

If all the address signals $A_0$ to $A_9$ fed to the external terminals, for example, are varied to the low level, the address signals $a_0$ to $a_9$ generated by the address buffer ADB shown in FIG. 1 are accordingly varied to the low level, whereas the address signals $\overline{a_0}$ to $\overline{a_9}$ are accordingly varied to the high level. As a result, all the parallel-connected MOSFETs $Q_{10}$ to $Q_{19}$ are rendered non-conductive. The common drain of the MOSFETs $Q_{10}$ to $Q_{19}$ are set at the precharge level, i.e., the high level, as a result of the fact that all of them are non-conductive. The high-level signal of the common drain is fed through the cut MOSFET $Q_{21}$ to the gate of the output MOSFET $Q_{22}$. As a result, the output MOSFET $Q_{22}$ is rendered conductive.

The output signal of the signal generator $\phi_x$-Gen, which is preset at the low level, is raised to the high level for a predetermined time period in accordance with the fact that the address signals are varied in the aforementioned manner. This high-level output signal of the generator $\phi_x$-Gen is transmitted through the output MOSFET $Q_{22}$ to the word line $W_0$. In other words, the word line $W_0$ is set at the select level. As a result, it is possible to select the memory MOSFET which is coupled to that word line $W_0$.

In the unit decoder UD$_{x0}$, a parasitic capacitance (not shown) exists between the gate and source of the output MOSFET $Q_{22}$. This parasitic capacitance is charged through the cut MOSFET $Q_{21}$. When the output of the signal generator $\phi_x$-Gen is varied to the high level after the parasitic capacitance has been charged, the word line $W_0$ has its signal accordingly varied to the high level. Since the parasitic capacitance substantially acts as a bootstrap capacitance, the gate potential of the MOSFET $Q_{22}$ is boosted to have a sufficiently high level as a result of the word line $W_0$ being raised to the high level. As a result, the conductance of the output MOSFET $Q_{22}$ is increased to a sufficiently high level. The cut MOSFET $Q_{21}$ is automatically rendered non-conductive by the bootstrap voltage fed from the parasitic capacitance, because its gate is maintained at the level of the power source voltage $V_{cc}$. As a result, the cut MOSFET $Q_{21}$ acts to prevent the charge of the parasitic capacitance from being discharged.

When the output of the signal generator $\phi_x$-Gen is returned from the high level to the low level, the word line $W_0$ is accordingly lowered to the low level through the output MOSFET $Q_{22}$.

In case at least one of the address signals $A_0$ to $A_9$ is boosted to the high level, at least one of the MOSFETs $Q_{10}$ to $Q_{19}$ of the unit decoder UD$_{x0}$ is accordingly rendered conductive. The common drain of the MOSFETs $Q_{10}$ to $Q_{19}$ is maintained at the low level even if the MOSFET $Q_{20}$ is rendered conductive by the precharge pulses Ce. The output MOSFET $Q_{22}$ is rendered non-conductive by the low-level signal at the common drain. As a result, the word line $W_0$ is maintained at the low level.

FIG. 4 shows one embodiment of the circuit of the Y address decoder Y-DCR$_1$ shown in FIG. 1. This Y decoder Y-DCR$_1$ is constructed of unit decoders UD$_{y0}$ to UD$_{y15}$ and logical circuits LG$_0$ to LG$_{15}$.

The unit decoders and the logical circuits are made so that all of the unit decoders are identical to one another and all of the logical circuits are identical to one another. FIG. 4 specifically shows the constructions of the unit decoder UD$_{y0}$ and the logical circuit LG$_0$.

The unit decoder UD$_{y0}$ is constructed of: logical MOSFETs $Q_{30}$ to $Q_{33}$ which are connected in parallel with one another and which are adapted to be fed with a predetermined combination of the address signals $a_{10}$ and $\overline{a_{10}}$ to $a_{13}$ and $\overline{a_{13}}$; a precharge MOSFET $Q_{34}$ which is connected with the common drain of the former MOSFETs; a cut MOSFET $Q_{35}$ and an output MOSFET $Q_{36}$ which is adapted to be fed with the decoded signals through the cut MOSFET $Q_{35}$. The output MOSFET $Q_{36}$ has its drain coupled to the output terminal of the signal generator $\phi_y$-Gen. The signal generator $\phi_y$-Gen is made to have a construction similar to that of the generator $\phi_x$-Gen to generate a high-level signal for a predetermined time period if any one group of the address signals $a_{10}$ and $\overline{a_{10}}$ to $a_{14}$ and $\overline{a_{14}}$ has its level varied.

The output signals $C_0$ to $C_{15}$ of the respective unit decoders of FIG. 4 are partly used as the select signals of the multiplexors shown in FIG. 1 and partly applied to the gates of the MOSFETs $Q_{37}$ and $Q_{38}$ of the logical circuits LG$_0$ to LG$_{15}$. The MOSFETs $Q_{37}$ and $Q_{38}$ of the respective logical circuits have their drains respectively fed with the address signals $a_{14}$ and $\overline{a_{14}}$. From the sources of the respective MOSFETs $Q_{37}$ and $Q_{38}$ of each of the logical circuits, there are generated the decoded signals $C_0$, $C_{1500}$ and so on which act as the AND outputs.

For example, if the address signals $A_{10}$ to $A_{13}$ are varied to the low level whereas the address signal $A_{14}$ is varied to the high level, the internal address signals $a_{10}$ to $a_{13}$ and $\overline{a_{14}}$ fed from the address buffers shown in FIG. 1 are accordingly varied to the low level, whereas the address signals $\overline{a_{10}}$ to $\overline{a_{13}}$ and $a_{14}$ are accordingly varied to the high level so that the parallelconnected MOSFETs $Q_{30}$ to $Q_{33}$ of the unit decoder UD$_{y0}$ are rendered non-conductive while the output MOSFET $Q_{36}$ is rendered conductive.

At this time, the high-level signal is generated from the signal generator $\phi_y$-Gen by the changes in the address signals. This high-level signal of the generator $\phi_x$-Gen is transmitted to the gates of the MOSFETs $Q_{37}$ and $Q_{38}$ through the output MOSFET $Q_{36}$ of the unit decoder UD$_{y0}$. As a result, the MOSFET $Q_{38}$ is rendered conductive. The high-level address signal $a_{14}$ fed to the drain of the MOSFET $Q_{38}$ is fed out through the same MOSFET $Q_{38}$. In sort, the high-level output signal $C_0$ and the high-level decoded signal $C_{01}$ are generated by the decoder Y-DCR$_1$.

Figure 5:
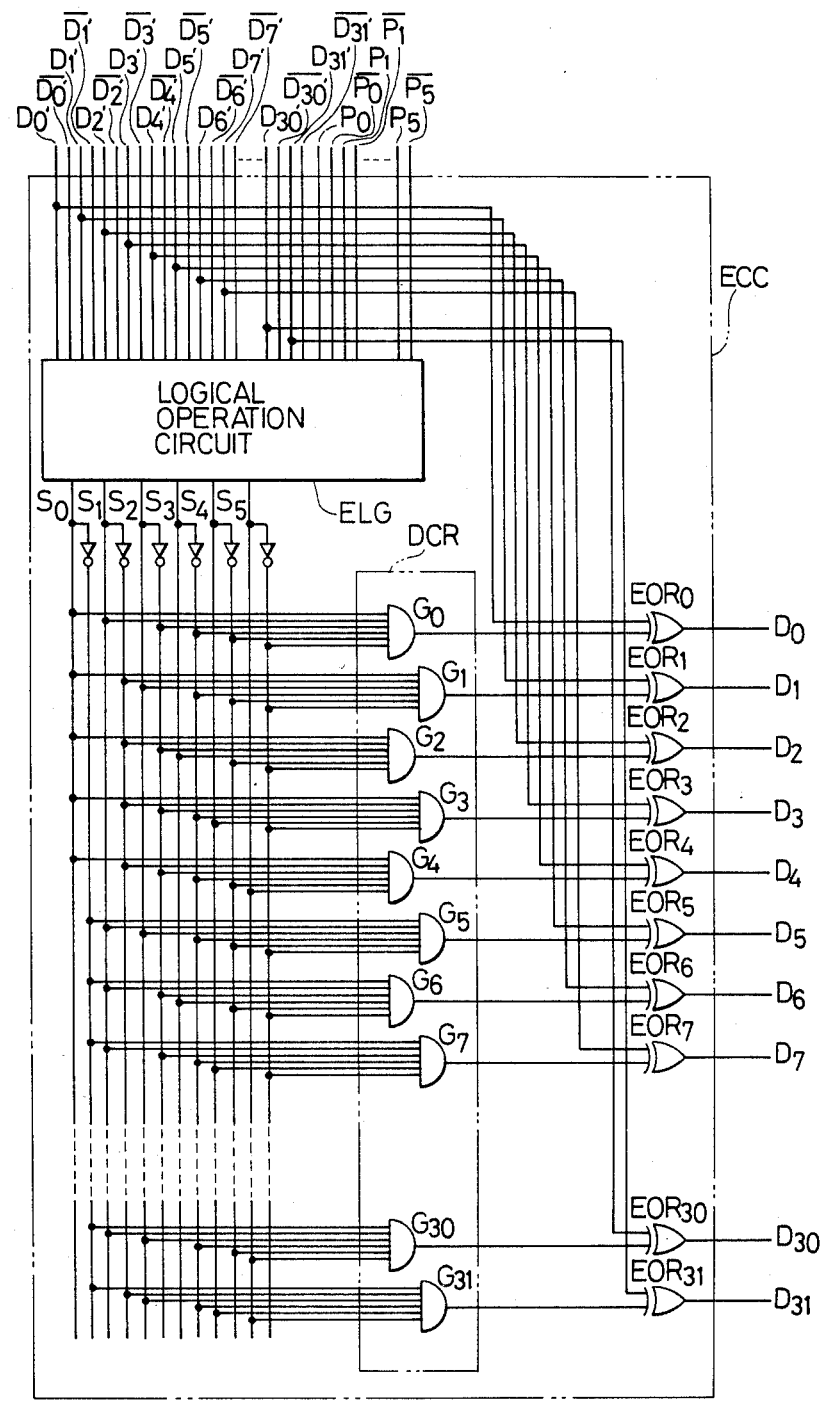
FIG. 5 is a circuit diagram showing an ECC circuit.

FIG. 5 is a circuit diagram showing one embodiment of the ECC circuit of FIG. 1.

A logical operation circuit ELG responds to the read signals $D_0'$ and $\overline{D_0'}$ to $D_{31}'$ and $\overline{D_{31}'}$, and $P_0$ and $\overline{P_0}$ to $P_5$ and $\overline{P_5}$ of 38 bits from the memory arrays thereby to form the syndromes $S_0$ to $S_5$ for designating the error bits from a predetermined combination of exclusive ORs.

The respective parity check bits $P_0$ to $P_5$ of 6 bits of the information of 38 bits written in the memory arrays have their values predetermined by the data signals of 32 bits and a suitable check matrix.

The following Table 1 tabulates one example of the check matrix:

TABLE 1

Check Matrix

| | | | | | | | | Bit No. Information Bits | | | | | | | | | | | |
|---|---|---|---|---|---|---|---|---|---|---|---|---|---|---|---|---|---|---|---|
| Syndromes | D$_0$ | D$_1$ | D$_2$ | D$_3$ | D$_4$ | D$_5$ | D$_6$ | D$_7$ | D$_8$ | D$_9$ | D$_{10}$ | D$_{11}$ | D$_{12}$ | D$_{13}$ | D$_{14}$ | D$_{15}$ | D$_{16}$ | D$_{17}$ | D$_{18}$ |
| S$_0$ | 1 | 1 | 1 | 1 | 1 | | | | | | | | | | 1 | 1 | 1 | 1 | 1 |
| S$_1$ | 1 | | | | | 1 | 1 | 1 | 1 | | | | | | 1 | 1 | 1 | 1 | |
| S$_2$ | | 1 | | | | 1 | | | | 1 | 1 | 1 | | | 1 | | | | 1 |
| S$_3$ | | | 1 | | | | 1 | | | 1 | | | 1 | 1 | | 1 | | | 1 |
| S$_4$ | | | | 1 | | | | 1 | | | 1 | | 1 | | | | 1 | | |
| S$_5$ | | | | | 1 | | | | 1 | | | 1 | | 1 | | | | 1 | |

| | | | | | | Bit No. | | | | | | | | | | | | |
|---|---|---|---|---|---|---|---|---|---|---|---|---|---|---|---|---|---|---|
| | | | | | | Information Bits | | | | | | | | Parity Bits | | | | | |
| Syndromes | D$_{19}$ | D$_{20}$ | D$_{21}$ | D$_{22}$ | D$_{23}$ | D$_{24}$ | D$_{25}$ | D$_{26}$ | D$_{27}$ | D$_{28}$ | D$_{29}$ | D$_{30}$ | D$_{31}$ | P$_0$ | P$_1$ | P$_2$ | P$_3$ | P$_4$ | P$_5$ |
| S$_0$ | 1 | 1 | 1 | | | | | | 1 | 1 | | | | 1 | | | | | |
| S$_1$ | | | | 1 | 1 | 1 | 1 | | | | 1 | | | | 1 | | | | |
| S$_2$ | 1 | | | 1 | 1 | | | 1 | 1 | 1 | | 1 | 1 | | | 1 | | | |
| S$_3$ | | 1 | 1 | 1 | | 1 | | 1 | 1 | | | | | | | | 1 | | |
| S$_4$ | 1 | 1 | | | 1 | | 1 | 1 | | | 1 | | 1 | | | | | 1 | |
| S$_5$ | | | 1 | | 1 | 1 | | 1 | 1 | 1 | 1 | | 1 | | | | | | 1 |

In the Table 1, flags 1 are attached to the bits to be referred to.

The following Table 2 tabulates a specified example of the written data W which is to be written in the memory arrays. In the Table 2, incidentally, characters B$_0$ to B$_{31}$ are attached to the data signals, whereas characters BP$_0$ to BP$_5$ are attached to the parity signals.

TABLE 2

| (W) | | | | | | | | | | | | | | | | | | | | |
|---|---|---|---|---|---|---|---|---|---|---|---|---|---|---|---|---|---|---|---|---|
| B$_0$ | B$_1$ | B$_2$ | B$_3$ | B$_4$ | B$_5$ | B$_6$ | B$_7$ | B$_8$ | B$_9$ | B$_{10}$ | B$_{11}$ | B$_{12}$ | B$_{13}$ | B$_{14}$ | B$_{15}$ | B$_{16}$ | B$_{17}$ | B$_{18}$ | B$_{19}$ | B$_{20}$ |
| 1 | 1 | 1 | 1 | 1 | 0 | 0 | 0 | 0 | 0 | 0 | 0 | 0 | 0 | 1 | 1 | 1 | 1 | 1 | 1 | 1 |

TABLE 2-continued

| (W) | | | | | | | | | | | | | | | | |
|---|---|---|---|---|---|---|---|---|---|---|---|---|---|---|---|---|
| $B_{21}$ | $B_{22}$ | $B_{23}$ | $B_{24}$ | $B_{25}$ | $B_{26}$ | $B_{27}$ | $B_{28}$ | $B_{29}$ | $B_{30}$ | $B_{31}$ | $BP_0$ | $BP_1$ | $BP_2$ | $BP_3$ | $BP_4$ | $BP_5$ |
| 1 | 0 | 0 | 0 | 0 | 0 | 0 | 1 | 1 | 0 | 0 | 1 | 1 | 1 | 1 | 1 | 1 |

The values of the respective parity bits are determined by the fact that those bits of the data signals of 32 bits to be written in, which are designated by the Table 1, are referred to. The parity bits to be determined are set at such values that the exclusive OR values of the bit signals referred to and the parity bits to be determined take a value of "0". In other words, the respective parity bits are so determined that the exclusive OR values of the bits to be referred to in view of the Table 1 take a value of "0".

For example, the parity bit $BP_0$ of the Table 2 is set in the following manner. In order to set the parity bit $BP_0$, more specifically, the data bits $B_0$ to $B_4$, $B_{14}$ to $B_{21}$, $B_{28}$ and $B_{29}$ of the data bits $B_0$ to $B_{31}$ of 32 bits are referred to in accordance with the first row (i.e., the syndrome $S_0$) of the Table 1. The exclusive OR of the data bits thus referred take the value "1". In accordance with this, the parity bit $BP_0$ take the value "1". In other words, the exclusive OR between the data bits referred to and the parity bit $BP_0$ is made to take the value "0".

In the following, the data is referred to on the basis of the syndromes $S_1$ to $S_5$ appearing in the second to fifth rows of the Table 1 so that the parity bits $BP_1$ to $BP_5$ are so determined as to have their exclusive OR values reduced to "0".

In case the respective data bits of 32 bits are set to have the values of the Table 2, all the parity bits $BP_0$ to $BP_5$ are made to have the value "1", as tabulated in the same table.

As is apparent from the Table 1 and the foregoing explanations relating to the same table, the logical equations for determining the syndromes $S_0$ to $S_5$ are expressed by the following equations (3) to (8):

$$S_0 = B_0 \oplus B_1 \oplus B_3 \oplus B_4 \oplus B_{14} \oplus B_{15} \oplus B_{16} \oplus \quad (3)$$
$$B_{17} \oplus B_{18} \oplus B_{19} \oplus B_{21} \oplus B_{28} \oplus B_{29} \oplus BP_0;$$

$$S_1 = B_0 \oplus B_5 \oplus B_6 \oplus B_7 \oplus B_8 \oplus B_{14} \oplus B_{15} \oplus B_{16} \oplus \quad (4)$$
$$B_{17} \oplus B_{22} \oplus B_{23} \oplus B_{24} \oplus B_{25} \oplus B_{30} \oplus BP_1;$$

$$S_2 = B_1 \oplus B_5 \oplus B_9 \oplus B_{10} \oplus B_{11} \oplus B_{14} \oplus B_{18} \oplus \quad (5)$$
$$B_{19} \oplus B_{22} \oplus B_{23} \oplus B_{26} \oplus B_{27} \oplus B_{28} \oplus B_{30} \oplus B_{31} \oplus BP_2;$$

$$S_3 = B_2 \oplus B_6 \oplus B_9 \oplus B_{12} \oplus B_{13} \oplus B_{15} \oplus B_{18} \oplus \quad (6)$$
$$B_{20} \oplus B_{21} \oplus B_{22} \oplus B_{24} \oplus B_{26} \oplus B_{27} \oplus BP_3;$$

$$S_4 = B_3 \oplus B_7 \oplus B_{10} \oplus B_{12} \oplus B_{16} \oplus B_{19} \oplus B_{20} \oplus \quad (7)$$
$$B_{23} \oplus B_{25} \oplus B_{26} \oplus B_{29} \oplus B_{31} \oplus BP_4;$$

and $$S_5 = B_4 \oplus B_8 \oplus B_{11} \oplus B_{13} \oplus B_{17} \oplus B_{21} \oplus B_{24} \oplus \quad (8)$$
$$B_{25} \oplus B_{27} \oplus B_{28} \oplus B_{29} \oplus B_{30} \oplus B_{31} \oplus BP_5$$

Incidentally, the symbols $\oplus$ appearing in the above logical equations indicate the exclusive OR.

The logical operation circuit ELG shown in FIG. 5 is constructed of logical circuits (not shown) for forming such syndromes $S_0$ to $S_5$ as satisfy the foregoing equations (3) to (8). Such logical circuit construction to satisfy such equations could be readily accomplished using well known principles of circuit design for exclusive OR operations. FIG. 6, which is discussed in detail later, gives one example of an exclusive OR circuit which could be used in this construction. Incidentally, the sequence of the exclusive OR compositions of the plural bits can be freely selected. In order to determine the exclusive OR values of the four bits $B_0$ to $B_3$, for example, therefore, the output $B_0 \oplus B_1$ is formed by the first exclusive OR circuit, and the output $B_2 \oplus B_3$ is formed by the second exclusive OR circuit so that these two outputs thus formed may be fed to the third exclusive OR circuit. As is apparent from the mutual comparisons of the equations (3) to (8), the exclusive OR values of the bits $B_{14}$ to $B_{17}$, for example, appear commonly in the equations (3) and (4). The exclusive OR value of the bits $B_{18}$ and $B_{19}$ appears commonly in the equations (3) and (5). In order to reduce the number of the logical circuits constructing the logical operation circuit ELG, therefore, the exclusive OR value shared among the respective equations may be formed in advance by the common, circuits, respectively.

The defects, which are established in advance in the memory MOSFET, switch MOSFET and signal line to be selected, and the substantial defects, which are caused during the operations of the circuit by the undesired changes in the circuit operating conditions, invite errors in the read out data which are to be fed to the ECC circuit.

An example of the error correcting operation will now be given wherein it is assumed that the memory cells to be written with the write data W which appears in Table 2 are selected and that the read out data R at that time makes such errors as are tabulated in the following Table 3. In other words, it is assumed that the seventh bit $B_7$ of the read out data R is changed from the value "0" to the value "1".

TABLE 3

| (R) | | | | | | | | | | | | | | | | | | | | |
|---|---|---|---|---|---|---|---|---|---|---|---|---|---|---|---|---|---|---|---|---|
| $B_0$ | $B_1$ | $B_2$ | $B_3$ | $B_4$ | $B_5$ | $B_6$ | $B_7$ | $B_8$ | $B_9$ | $B_{10}$ | $B_{11}$ | $B_{12}$ | $B_{13}$ | $B_{14}$ | $B_{15}$ | $B_{16}$ | $B_{17}$ | $B_{18}$ | $B_{19}$ | $B_{20}$ |
| 1 | 1 | 1 | 1 | 1 | 0 | 0 | 1 | 0 | 0 | 0 | 0 | 0 | 0 | 1 | 1 | 1 | 1 | 1 | 1 | 1 |

| $B_{21}$ | $B_{22}$ | $B_{23}$ | $B_{24}$ | $B_{25}$ | $B_{26}$ | $B_{27}$ | $B_{28}$ | $B_{29}$ | $B_{30}$ | $B_{31}$ | $BP_0$ | $BP_1$ | $BP_2$ | $BP_3$ | $BP_4$ | $BP_5$ |
|---|---|---|---|---|---|---|---|---|---|---|---|---|---|---|---|---|
| 1 | 0 | 0 | 0 | 0 | 0 | 0 | 1 | 1 | 0 | 0 | 1 | 1 | 1 | 1 | 1 | 1 |

The logical operation circuit ELG in the ECC circuit logically calculates the syndromes $S_0$ to $S_5$ in accordance with the equations (3) to (8) when it is fed with data R. In the calculating procedures for determining the syndromes $S_0$ to $S_5$, the seventh bit $B_7$ is used in the logical operation to determine the syndromes $S_1$ and $S_4$, as is apparent from Table 1. As a result of the seventh bit $B_7$ *being changed from* "0" to "1", the syndromes $S_1$ and $S_4$ respectively take the value "1". There is no error in the bits which are to be introduced into the calculating procedures of determining the other syndromes $S_0$, $S_2$, $S_3$ and $S_5$. As a result, the syndromes $S_0$, $S_2$, $S_3$ and $S_5$ respectively take the value "0".

When the read out data R tabulated in Table 3 is fed out, more specifically, the bit patterns of the syndromes $S_5$ to $S_0$ generated by the logical operation circuit ELG are expressed by "010010". This bit pattern becomes coincident with the bit pattern of the syndromes $S_5$ to $S_0$ indicating the seventh bit $D_7$ in the check matrix of the Table 1. In this check matrix, more specifically, the pattern of the syndromes $S_5$ to $S_0$ in the row of the bit $D_7$ is expressed by "010010", which is coincident with the bit pattern of the syndromes $S_5$ to $S_0$ generated from the logical operation circuit. Here, the blank columns in the check matrix are deemed to take the value "0".

As is apparent from the Table 1, the respective signals of 38 bits are set with the plural check bits. The check bits set for one signal have such a pattern as corresponds only to that signal. As a result of the fact that the check matrix is made to have the construction as tabulated in the Table 1, the bit pattern, which is constructed of the syndromes $S_5$ to $S_0$ fed from the logical operation circuit ELG shown in FIG. 5, corresponds one-to-one to the positions of the error data bits of the read out data R.

The syndromes $S_0$ to $S_5$ generated by the logical operation circuit ELG are fed either directly or through inverters to the decoder DCR. This decoder DCR is made operative to decode the syndromes $S_0$ to $S_5$ thereby to generate the decoded signals indicative of the error units. The decoder DCR is constructed of AND gates $G_0$ to $G_{31}$ which are made to correspond one-to-one to the data signals of 32 bits, although not especially limited thereto. The respective AND gates $G_0$ to $G_{31}$ have their respective inputs so determined as to detect the different bit patterns. Each of the AND gates generates the "0" level, unless the data bits corresponding thereto are erroneous, and the "1" level if those bits are erroneous. For example, the AND Gate $G_0$ generates the "1" level signal, if the first unit (or the first bit) signal of the data signals of 32 bits is erroneous, and otherwise the "0" level signal, as is apparent from both the shown connections and the check matrix of the Table 1.

The respective outputs of the decoder DCR, i.e., the outputs of the AND gates $G_0$ and $G_{31}$ and the information bits $B_0$ to $B_{31}$ of the read out data R are respectively fed to the exclusive OR circuits $EOR_0$ to $EOR_{31}$. These exculsive OR circuits $EOR_0$ to $EOR_{31}$ form the error-corrected output data $D_0$ to $D_{31}$ which are to be fed to the multiplexor $MPX_0$ shown in FIG. 1. If an error exists in the seventh data signal shown in the Table 3, for example, the output of the AND gate $G_6$ accordingly take the value "1" sothat the seventh signal read out erroneously as the aforementioned value "1" is inverted from the value "1" to the value "0" by the exclusive OR circuit $EOR_7$. In other words, the data signal $D_6$ is corrected to the right value.

Incidentally, the ECC circuit according to the present embodiment is enabled to correct an error of 1 bit but will not correct an error of 2 or more bits. Although it is possible to provide an ECC circuit which can correct an error of 2 or more bits, the construction is complicated, and the number of the elements is increased. In this case, moreover, the parity bits have to be remarkably increased.

Figure 6:
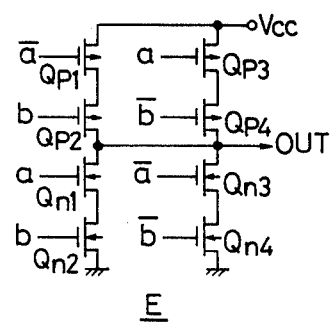
FIG. 6 is a circuit showing an exclusive OR circuit.

FIG. 6 shows one specific embodiment of the inside of the logical operation circuit ELG and the exclusive OR circuit to be used for the error correction. This exclusive OR circuit is constructed of p-channel type MOSFETs $Q_{p1}$ to $Q_{p4}$ and n-channel MOSFETs $Q_{n1}$ and $Q_{n2}$ are respectively arranged in series, and the MOSFETs $Q_{p3}$ and $Q_{p4}$ and the MOSFETs $Q_{n3}$ and $Q_{n4}$ are likewise arranged in series. The node between the MOSFETs $Q_{p2}$ and $Q_{n1}$ and the node between the MOSFETs $Q_{p4}$ and $Q_{n3}$ are commonly connected to generate an output OUT. The MOSFETs $Q_{n1}$ and $Q_{n2}$ have their gates respectively fed with input signals a and b, and the MOSFETs $Q_{n3}$ and $Q_{n4}$ have their gates respectively fed with input signals $\bar{a}$ and $\bar{b}$.

On the other hand, the MOSFETs $Q_{p1}$ and $Q_{p4}$ have their gates respectively fed with the input signals $\bar{a}$ and $\bar{b}$, and the MOSFETs $Q_{p2}$ and $Q_{p3}$ have their gates respectively fed with the input signals b and a.

Now, when both the input signals a and b are at the high ("1") level, the MOSFETs $Q_{n1}$ and $Q_{n2}$ are rendered conductive to vary the output OUT to the low ("0") level. On the other hand, MOSFETs $Q_{n3}$ and $Q_{n4}$ are rendered conductive to likewise vary the output OUT to the low level.

Moreover, when the input signal a (or $\bar{a}$) is at the low level and the input signal $\bar{b}$ (or b) is at the low level, the MOSFET $Q_{p3}$ (or $Q_{p1}$) and the MOSFET $Q_{p4}$ (or $Q_{p2}$) are rendered conductive to boost the output OUT to the high level. When the input signals a and b have their levels thus made coincident, the output OUT is varied to the low level. In the case of inconsistency, on the other hand, the output OUT is raised to the high level.

The exclusive OR circuit shown has a small number (e.g., 8) of elements and allows no current to flow between the power source voltage $V_{cc}$ and the ground potential. Therefore, it can enjoy an advantage that its power consumption is remarkably low.

The logical operation circuit ELG of the ECC circuit internally conducts such logical operations as are expressed by the foregoing logical equations (3) to (8) so as to form the syndromes $S_0$ $S_5$, as has been described hereinbefore. In other words, a number of the exclusive OR operations are conducted in the logical operation circuit.

By using the exclusive OR circuit shown in FIG. 6 as the logical circuit constructing the logical operation circuit ELG, it becomes possible to construct the logical operation circuit using a relatively small number of the elements and to reduce the power consumption to a relatavely low level.

As has been described with reference to FIG. 2, moreover, the data read out of the left-hand input and output terminals of the respective sense amplifiers always become a positive-phase output $D_n'$ whereas the data read out of the right-hand input and output terminals always become a negative-phase output $\overline{D_n'}$ as a result of the fact that the inverted information is written in the right-hand memory arrays M-$ARY_3$ and M-$ARY_4$. Accordingly, the data read out of the sense amplifiers can be fed directly in the form it is in to the exclusive OR circuits in the logical operation circuit ELG so that this circuit ELG can be further simplified.

In the circuit according to this embodiment, as has been described hereinbefore, the respective information and parity signals constructing one set of the data are extracted from the respective memory groups (i.e. 38 memory groups), each of which is constructed of the 32 memory cells (i.e., the memory MOSFETs).

Each of the memory cell groups is constructed of the 32 memory MOSFETs which have their respective gates coupled to one word line and their drains and sources connected in series, as is apparent from FIG. 2. The memory MOSFETs are selected one by one from the respective memory cell groups in response to the decoded signals fed from the X decoder X-DCR$_1$ or X-DCR$_2$ and the decoded signals fed from the Y decoder Y-DCR$_1$. In this case, the orders or positions of the respective memory cell groups of the memory MOSFETs to be selected are identical to each other. In other words, the plural signals constructing one set of data are read out of the memory MOSFETs which are located at every 32 ones and which are coupled to one word line.

In the large-capacity memory of the monolithic IC type, generally speaking, a defect is liable to occur simultaneously in the plural memory cells which are adjacent to each other. This defect can be caused, for example, by the incompleteness which is inevitable in the IC fabrication technique. The mask films, which are made of photoresist for selectively etching insulating and/or conducting films, for example, are not always produced to a satisfactory level because they are adversely affected by the irregularity in their material or by dust. If defects such as undesirable roughnesses or pin holes exist in the pattern of the mask film which is used, they are transferred to the insulating or conducting films which that mask film is used with. If the mask film is to be used for implanting impurity ions, these impurity ions may be introduced into the undesired portion of the surface of the semiconductor substrate or may not be introduced into the desired portion. Also, it is possible that the semiconductor substrate to be used intrinsically has a defect, e.g., a crystal defect, which will deteriorate the characteristics of the semiconductor elements to be formed thereon.

In a large-capacity memory, the semiconductor elements and the wiring layers are made to have fine sizes so as to ensure high integration. As a result, a plurality of circuit elements are liable to be included in the area of one defect.

For the mask type ROM shown in FIGS. 2A to 2C, it is possible to switch the column switch MOSFETs $S_{a0}$ and $S_{a1}$, for example, in response to the common decoded signal $C_0$ and to the outputs of the column switch MOSFETs $S_{a0}$ and $S_{a1}$ to different sense amplifiers. In this case, the pieces of information of the memory MOSFETs $M_0$ and $M_1$, for example, can be simultaneoudly extracted by boosting the potentials of the word line $W_0$ and the decoded signals $C_0$ and $C_{01}$ to the high level. In this case, however, the memory MOSFETs adjacent to each other are selected. Accordingly, the possibility exists that the pieces of information of 2 or more bits simultaneously extracted become erroneous. If these two bits are to be corrected in the ECC circuit, as has been described hereinbefore, many parity bits are required. For example, if the ECC circuit is to have 2-bit correcting capability, the number of the parity bits is significantly increased to twice that necessary for 1-bit correction. Therefore, this is generally not practical because the substantial data storage capacity of the memory is accordingly remarkably reduced.

To avoid this problem of a 2-bit error produced by adjacent memory cells, according to the present invention, one group of data to be fed to the ECC circuit is constructed of signals which are read out of the plural memory cells formed in scattered positions on the semiconductor chip. The embodiment shown in FIGS. 2A to 2C will be described as an example of this. To begin with, adjacent memory cells (i.e., the memory MOSFETs), e.g., the MOSFETs $M_0$ and $M_1$ are not simultaneously selected. As a result of the fact that the respective column switch MOSFETs are switched in response to the different decoded signals, it is possible to always extract nothing but the information of 1 bit. Since such groups are formed as a plurality, it is possible to simultaneously extract the information of plural bits. Since the groups are made to have similar constructions, there are always formed between two memory MOSFETs to be selected such a number of the memory MOSFETs as can construct one side of one group. As a result, the distance between the memory MOSFETs to be selected is made to have a relatively large value. In other words, the plural bits constructing the data fed to the ECC circuit are extracted from the memory MOSFETs which are formed in scattered positions on the chip. The plural defective cells formed in a concentrated manner are therefore scattered into plural groups of data. As a result, the error bits included in one group of data can be reduced to about 1 bit at the most. Thus, even the ECC circuit described previously having a low error correcting ability (e.g., 1 bit correcting ability) can correct the error bit. As a result, the fabrication yield of the semiconductor memory can be significantly improved.

In the semiconductor memory according to the embodiment shown in FIGS. 2A to 2C, a desired number of the memory MOSFETs are selected from the plural memory MOSFETs (i.e., the memory cells (coupled to one word line so that a necessary number of bits can be fed to the ECC circuit by the single addressing operation. Thus, the information can be read out at a relatively high speed.

In accordance with the present invention, the ECC circuit having a low correcting ability as described above can be used to simplify its circuit construction and to reduce the number of the parity bits. As a result, it is possible to enlarge the substantial data storage capacity.

It is to be understood that the preent invention should not be limited to the embodiments thus far described. In the circuit of the embodiment shown in FIGS. 2A to 2C, for example, of the MOSFETs constructing the dummy cells, the MOSFETs $Q_{d1}$ and $Q_{d2}$ may be replaced by the single MOSFET which is made to have a conductance equal to the composite conductance of those two MOSFETs. In case the increase in the power consumption is allowed, moreover, the MOSFET $Q_s$ may be dispensed with. In addition, the MOSFET $Q_s$ can also be dispensed with by applying a signal such as the address signal $a_9$ to one of the MOSFETs $Q_{d1}$ and $Q_{d2}$ and a signal such as the decoded signal $C_0$ to the other. In this modification, there is no increase in the power consumption. Furthermore, the information to be written in the memory array M-ARY$_3$ and M-ARY$_4$ does not have to be inverted. In this modification, however, it is necessary to accordingly modify the ECC circuit. Of course, if desired, an alternative ECC circuit to the one shown in FIG. 5 may be used.

Although the present invention has been described in the context of a horizontal mask ROM, it is to be understood that it could also be applied to a vertical type mask ROM and a programmable ROM (e.g., EPROM or EAROM). Further, it can also be applied to a random access memory (i.e., RAM). Moreover, the arrangement of the memory cell to be stored with plural bits (including parity bits) constructing one set of data may be made such that the memory cells are spaced alternately by at least one of them.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor memory comprising:
   a first and second memory array each including: a plurality of read only memory cells each having a selection terminal, an output terminal and a reference terminal and arranged in a matrix form; a plurality of word lines arranged in parallel in a direction of columns of said matrix; a plurality of data lines arranged in parallel in a direction of rows of said matrix; and a plurality of grounding lines arranged in parallel in the direction of said rows;
   said selection terminal of each read only memory cell being connected to one of said word lines, said output terminal of each read only memory cell being connected to one of said data lines, and said reference terminal of each read only memory cell being connected to one of said grounding lines;
   first and second common data lines;
   a differential sense amplifier having a pair of input terminals, one of which is coupled to said first common data line and the other of which is coupled to said second common data line;
   a first column switch which is arranged between said first common data line and said first memory array and which is controlled by first switch control signals respectively to couple one of the plural data lines of said first memory array to said first common data line;
   a second column switch which is arranged between said second common data line and said second memory array and which is controlled by second switch control signals to selectively couple one of the plural data lines of said second memory array to said second common data line;
   a plurality of dummy cells provided to respectively correspond to the data lines of said first and second memory arrays and each including: an output terminal to be coupled to the corresponding one of said data lines; a selection terminal to be fed with an operation control signal; and a reference terminal to be fed with a ground potential of the circuit; said dummy cells operating to apply a reference potential for said differential sense amplifier to the corresponding ones of said data lines when they are respectively brought into their operative states; and
   a selecting circuit including a first plurality of output terminals, which are to be coupled to the word lines of said first and second memory arrays and a second plurality of output terminals which are to be coupled to the selection terminals of said dummy cells,
   wherein the reference potential, which is provided for said differential sense amplifier when one of the memory cells of said first memory array is selected, is generated by that one of said dummy cells which is coupled to said second memory array, while the reference potential, which is provided for said differential sense amplifier when one of the memory cells of said second memory array, is generated by that one of said dummy cells which is coupled to said first memory array.

2. A semiconductor memory according to claim 1, wherein said first column switch comprises a plurality of first switching elements which are controlled by said first switch control signals and which are coupled between said first common data line and the plurality of data lines of said first memory array so as to selectively couple a predetermined one of said data lines of said first memory array to said first common data line in response to predetermined signal levels of said first switch control signals, and
wherein said second column switch comprises a plurality of second switching elements which are controlled by said second switch control signals and which are coupled between said second common data line and the plurality of data lines of said second memory array so as to selectively couple a predetermined one of said plurality of data lines of said second memory array to said second common data line in response to predetermined signal levels of said second switch control signals.

3. A semiconductor memory according to claim 2, wherein said switching elements are MOSFETs.

4. A semiconductor memory according to claim 2, wherein at least one of said first switching elements is coupled in series between each of said data lines of said first memory array and said first common data line, and wherein at least one of said second switching elements is coupled in series between each of said data lines of said second memory array and said second common data line.

5. A semiconductor memory according to claim 2,
   wherein each of said memory cells includes a memory semiconductor element having either a first or second conductance when each of said memory semiconductor elements is selected, said first and second conductances corresponding to a value of memory information stored in said memory semiconductor element, and
   wherein each of said dummy cells includes at least one semiconductor element having an intermediate conductance between said first and second conductances when each of them is operated,
   so that said differential sense amplifier is fed with a signal at such a level as is determined by the conductance of the memory cell selected and a reference potential determined by the conductance of the operated one of said dummy cells.

6. A semiconductor memory according to claim 5,
   wherein said differential sense amplifier includes a pair of MOSFETs which have their drains and gates cross-coupled to each other and one of which has its drain coupled to said first common data line while the other has its drain coupled to said second common data line.

7. A semiconductor memory according to claim 5, further comprising switch elements connected between respective grounding lines of said first and second memory arrays and a ground point of the circuit and coupled to be respectively switched by an output signal of said selecting circuit, wherein only grounding lines corresponding to the data lines which are to be selected by said first and second column switches are coupled through said switch elements to the ground point of the circuit.

8. A semiconductor memory according to claim 7, wherein a common grounding line is coupled to adjacent rows of the memory cells of each of said first and second memory arrays.

9. A semiconductor memory according to claim 5, wherein the dummy cells coupled to said first memory array and the dummy cells coupled to said second memory array are complementarily operted by an address signal which is fed to said selecting circuit.

10. A semiconductor memory according to claim 5, wherein said selecting circuit generates control signals for bringing only that one of said dummy cells coupled to said second memory array, which is coupled to the data line to be selected by said second column switch, into its operative state when the memory cells of said first memory array are selected, and for bringing only that one of said dummy cells coupled to said first memory array, which is coupled to the data line to be selected by said first column switch, into its operative state when the memory cells of said second memory array are selected.

11. A semiconductor memory according to claim 10, further comprising a plurality of precharge elements for respectively precharging the said plurality of data lines of said first and second memory arrays.

12. A semiconductor memory according to claim 11, further comprising:
an address buffer made responsive to address signals for generating signals to be fed to said selecting circuit; and
a control circuit for detecting changes in said address signals thereby to generate a control signal to control the operations of said precharge elements and a control signal to control the operations of said selecting circuit,
wherein said selecting circuit is substantially dynamically operated by a control signal which is fed from said control circuit.

13. A semiconductor memory according to claim 10, wherein each of said memory cells includes a memory MOSFET having a high or low threshold voltage corresponding to information to be stored, and
wherein each of said dummy cells includes at least one MOSFET.

14. A semiconductor memory according to claim 13, wherein each of said dummy cells includes two series-connected MOSFETs each having a size and characteristics which are substantially identical to those of the memory MOSFETs respectively having the low threshold voltages so that a composite conductance of said two series-connected MOSFETs is approximately half of the conductance of said memory MOSFETs having a low threshold voltage.

15. A semiconductor memory according to claim 13, wherein each of said dummy cells includes: a first MOSFET having a gate electrode which is to be fed with one of address signals fed to said selecting circuit; and a second MOSFET having a gate electrode which is to be fed with a decoded signal derived from said selecting circuit, and a drain path connected in series with the source and drain path of said first MOSFET.

16. A semiconductor memory according to claim 13, wherein the respective memory MOSFETs of said first memory array have a high threshold voltage to correspond to a predetermined state of stored information and the respective memory MOSFETs of said second memory array have a low threshold voltage to correspond to said predetermined state of stored information.

* * * * *